(12) United States Patent
Khanpour et al.

(10) Patent No.: US 8,106,807 B2
(45) Date of Patent: Jan. 31, 2012

(54) BUBBLE CORRECTION IN A FLASH ANALOG-TO-DIGITAL CONVERTER

(75) Inventors: Mehdi Khanpour, Irvine, CA (US); Adesh Garg, Aliso Viejo, CA (US); Bo Zhang, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 94 days.

(21) Appl. No.: 12/795,370

(22) Filed: Jun. 7, 2010

(65) Prior Publication Data

US 2011/0298641 A1    Dec. 8, 2011

(51) Int. Cl.
*H03M 1/36* (2006.01)
(52) U.S. Cl. .................... 341/160; 341/155
(58) Field of Classification Search .......... 341/130–165
See application file for complete search history.

(56) References Cited

U.S. PATENT DOCUMENTS

| | | | | |
|---|---|---|---|---|
| 5,623,265 | A * | 4/1997 | Pawar et al. | 341/160 |
| 6,633,250 | B2 * | 10/2003 | Lee et al. | 341/160 |
| 6,720,959 | B2 * | 4/2004 | Haroun et al. | 345/213 |
| 7,439,889 | B2 * | 10/2008 | Fujimoto | 341/143 |
| 7,994,960 | B1 * | 8/2011 | Li | 341/158 |
| 8,022,855 | B2 * | 9/2011 | Kijima | 341/160 |

\* cited by examiner

*Primary Examiner* — Lam T Mai
(74) *Attorney, Agent, or Firm* — Sterne, Kessler, Goldstein & Fox P.L.L.C.

(57) ABSTRACT

Embodiments of a flash analog-to-digital converter (ADC) that can detect and suppress bubbles in a thermometer code of a flash ADC are provided herein. Bubbles can result in large sparkle errors, which degrade the bit error rates (BER) of flash ADCs. The present invention utilizes a bubble correction module that is configured to provide a bubble corrected one-of-N code by suppressing at least one of any two tops that are not separated by at least two levels within a one-of-N code.

24 Claims, 6 Drawing Sheets

US 8,106,807 B2

BUBBLE CORRECTION IN A FLASH ANALOG-TO-DIGITAL CONVERTER

FIELD OF THE INVENTION

This application relates generally to analog-to-digital converters (ADCs) and more particularly to bubble correction in flash analog-to-digital converters.

BACKGROUND

The design of voltage-referenced, high precision analog circuits has become more challenging as advances in integrated circuit (IC) technology have led to smaller feature sizes and lower IC operating voltage levels. For example, in flash analog-to-digital converters (ADCs), reductions in IC operating voltage levels have resulted in smaller dynamic ranges. In order to maintain the same resolution in a flash ADC implemented in these lower voltage IC technologies, the voltage reference step (known as the least significant bit (LSB)) of a flash ADC has to be correspondingly reduced. However, any reduction in the voltage reference step is typically limited by inherent offsets in the comparators of a flash ADC, caused by random mismatches between transistors produced in the IC process. These offset can be reduced with the help of calibration, but not totally eliminated. As a result, bubbles can be produced in the thermometer code of common flash ADCs. These bubbles can result in large sparkle errors, which degrade the bit error rate (BER) of a flash ADC.

Therefore, what is needed is a system for detecting and correcting bubble errors.

BRIEF DESCRIPTION OF DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

It is noted that the use of a "logical one" value versus a "logical zero" value in many of the embodiments described herein is an arbitrary choice. Selection of either logical value can be used with minor modifications to many of the embodiments described herein without departing from the scope and spirit of the present invention as would be appreciated by one of ordinary skill in the art.

Figure 1:
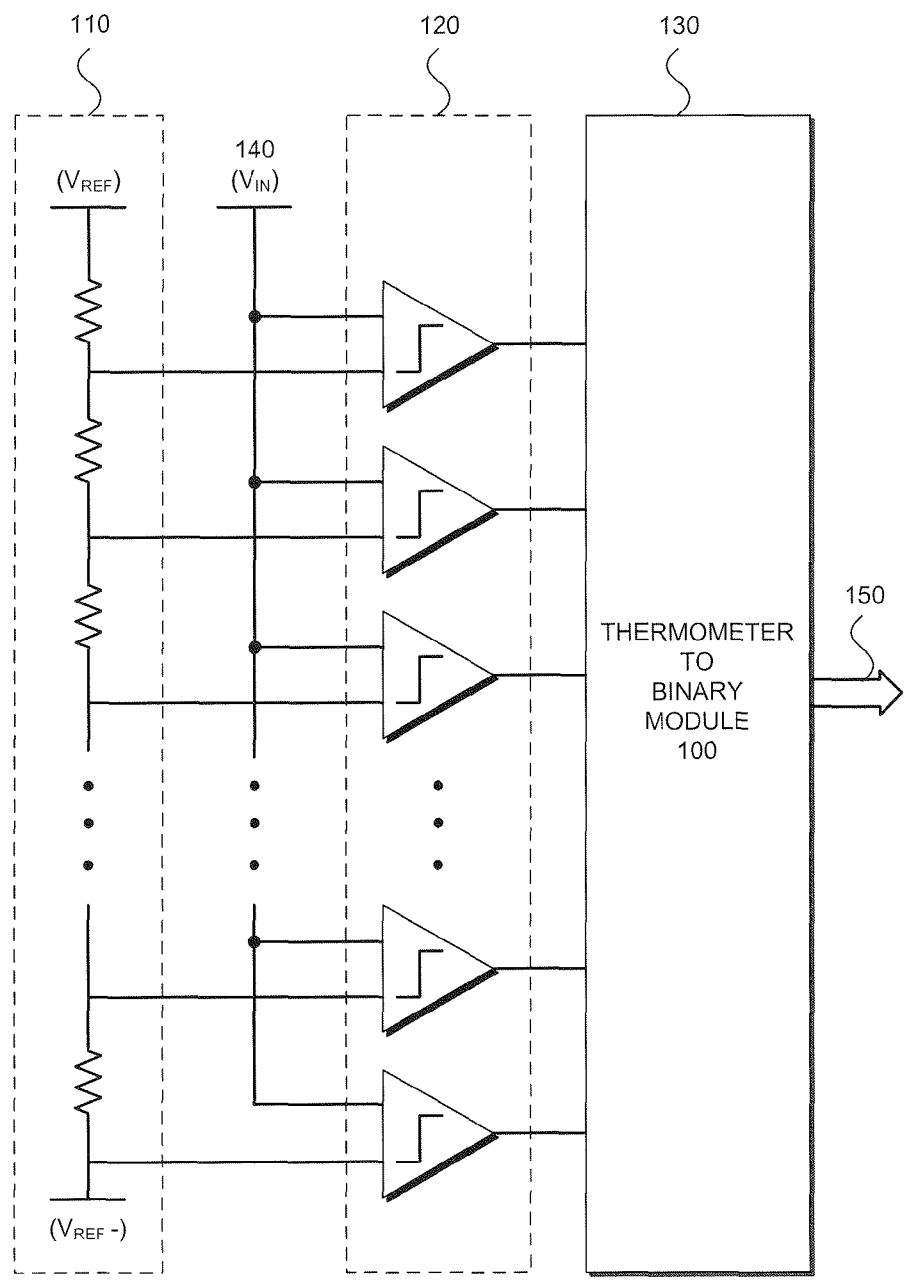
FIG. 1 illustrates a block diagram of a flash ADC, according to embodiments of the present invention.

FIG. 1 illustrates a block diagram of an n-bit flash ADC 100, according to embodiments of the present invention. Flash ADC 100 includes a voltage reference module 110, a comparator module 120, and a thermometer to binary module 130.

In operation, flash ADC 100 is configured to receive and convert an analog voltage (or current) 140 into a binary code 150 having n-bits of precision. Binary code 150 is a digital number that is proportional to the magnitude of analog voltage 140. During the conversion process, analog voltage 140 typically is compared in parallel to $2^n-1$ voltage references provided by voltage reference module 110. In an embodiment, voltage reference module 110 is a linear voltage ladder that provides $2^n-1$ evenly spaced voltage references to comparator module 120. The linear voltage ladder can be constructed from equal valued resistors coupled in series between two voltage sources $V_{REF}+$ and $V_{REF}-$ as illustrated in FIG. 1. In another embodiment, the linear voltage ladder can be provided by capacitive voltage division.

Comparator module 120 typically includes $2^n-1$ comparators and each comparator compares analog voltage 140 to a different one of the $2^n-1$ voltage references provided by voltage reference module 110. The comparators determine whether analog voltage 140 is less than or greater than each voltage reference. In an embodiment, each comparator is configured to produce a logical one if analog voltage 140 is greater than the voltage reference and a logical zero if analog voltage 140 is less than the voltage reference. The results of these comparisons form what is referred to as a thermometer code at the output of comparator module 120. A thermometer code generally has one digital level for each possible, non-zero output code of flash ADC 100 (i.e., $2^n-1$ digital levels for an n-bit ADC). Ideally, for any given analog voltage 140, all digital levels below the value of analog voltage 140 are a logical one and all above are a logical zero. The point in the thermometer code where a logical one transitions to a logical zero is commonly referred to as the top, and the digital level at this transition point is the digital level that closely or most accurately represents analog voltage 140.

The final stage of the conversion process is performed by thermometer to binary module 130. Thermometer to binary module 130 receives the thermometer code produced by comparator module 120 and converts this code into binary code 150. Implementations of thermometer to binary module 130 are explained further below.

In general, flash converters, such as flash converter 100, are used where fast conversion of an analog input into a digital representation is needed. Slower ADCs generally use some form of successive approximation to converge on a digital output code that closely or most accurately represents a given analog input voltage. In contrast to these slower ADCs, which narrow in on the "correct" answer, a flash ADC uses a large number of comparators as illustrated in FIG. 1 to compare an input analog voltage to all possible voltage reference levels (or a substantial number of them) in parallel to quickly determine the digital output code that closely or most accurately represents the analog input voltage.

Figure 2:
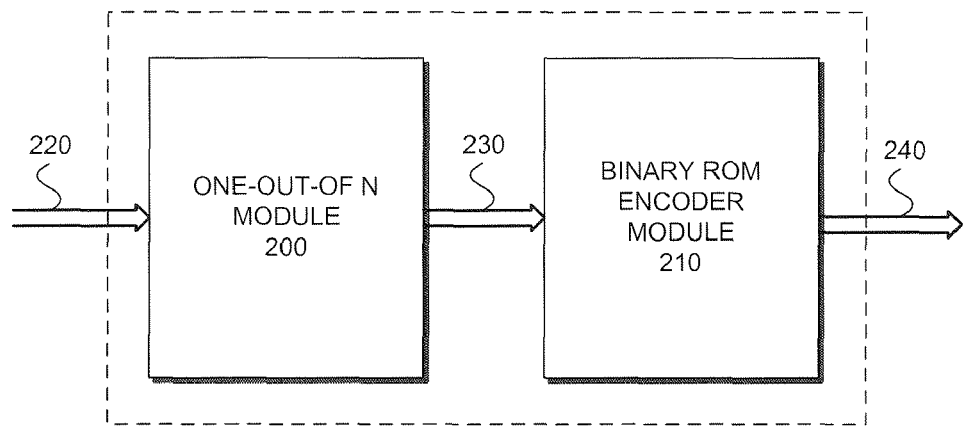
FIG. 2 illustrates a block diagram of a thermometer to binary module, according to embodiments of the present invention.

FIG. 2 illustrates a block diagram of thermometer to binary module 130, according to embodiments of the present invention. Thermometer to binary module 130 includes a one-out-of N module 200 and a binary ROM encoder module 210.

In operation, one-out-of N module 200 receives the thermometer code produced by comparator module 120 (illustrated in FIG. 1) at input 220 and detects any one-to-zero transitions in the thermometer code. As noted above, a one-to-zero transition in the thermometer code is commonly referred to as a top and denotes the digital level in the thermometer code that closely or most accurately represents analog voltage 140. One-out-of N module 200 is configured to produce a one-of-N code at its output 230 and to denote a top detected in the thermometer code by either a logical zero or a logical one in the one-of-N code. Any other value in the thermometer code that is not a top is denoted by a logical value that is opposite to the logical value used to denote the top in the one-of-N code. In an embodiment, one-out-of N module 200 is configured to denote a top detected in the thermometer code by a logical zero in the one-of-N code and any other value that is not a top by a logical one.

Binary ROM encoder module 210 is configured to receive the one-of-N code and provide a binary code at output 240 that represents the digital level where the top exists in the one-of-N code (assuming a top exists). The digital level where the top exists in the one-of-N code is the value that closely or most accurately represents analog voltage 140. Ideally, there is at most a single top in any one-of-N code produced. However, as will be explained further below, random mismatches between transistors used to implement flash ADC 100 illustrated in FIG. 1 often create offsets in the comparators of comparator module 120 (and other modules) that result in additional tops or what are commonly referred to as bubbles in the thermometer code. These bubbles can result in large sparkle errors, which degrade the bit error rate (BER) of a flash ADC, such as flash ADC 100.

Figure 3:
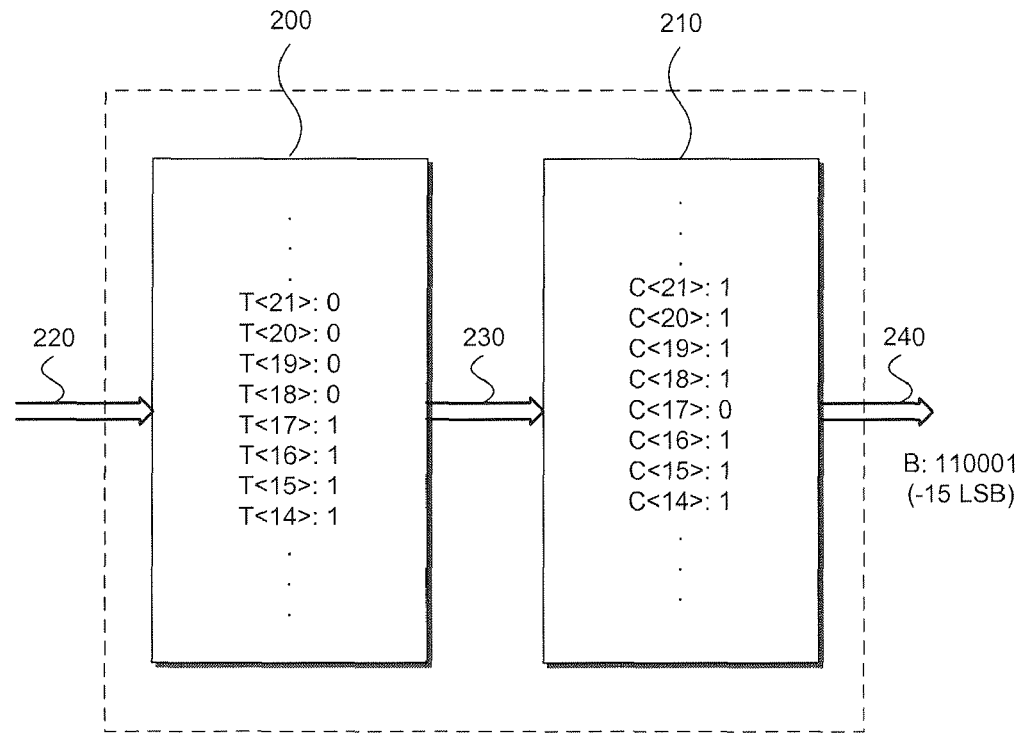
FIG. 3 illustrates the operation of the thermometer to binary module illustrated in FIG. 2, according to embodiments of the present invention.

FIG. 3 illustrates an exemplary conversion operation performed by thermometer to binary module 130, according to embodiments of the present invention. Specifically, FIG. 3 illustrates an exemplary 64-bit thermometer code T<1:64> received by one-out-of N module 200 at input 220. In the case of a 64-bit thermometer code that corresponds to a 6-bit flash ADC, one-out-of N module 200 may be more specifically referred to as a one-out-of 64 module and one-of-N code may be more specifically referred to as a one-of-64 code.

Only bits or levels 14-21 of interest are shown by the thermometer code in FIG. 3 bits 1-13 are assumed to contain all logical one values and bits 22-64 are assumed to contain all logical zero values. Thus, a single transition point or top exists in the thermometer code at level 17. Recall that the thermometer code is the output of the comparators in comparator module 120, which compare analog input 140 to a series of successively larger reference voltages that span the dynamic range of ADC 100. The one to zero transition in the thermometer code (ideally) signifies the point where the reference voltages become larger in magnitude than analog input 140. Thus, level 17 in the thermometer code corresponds to the digital value that closely or most accurately represents analog voltage 140 in this instance.

The thermometer code shown in FIG. 3 is processed by one-out-of N module 200 to produce a one-of-N code C<1:64>, which is provided to binary ROM encoder module 210 at output 230. Binary ROM encoder module 210, as will be explained further below, converts the one-of-N code into a binary code that reflects the position of the top. In this specific example, where the top is at level 17 as denoted by the logical zero at position 17 in the one-of-N code, the binary code produced by binary ROM encoder module 210 is "110001" or −15 LSB as illustrated in FIG. 3 (assuming a dynamic range of −32 to +31).

Figure 4:
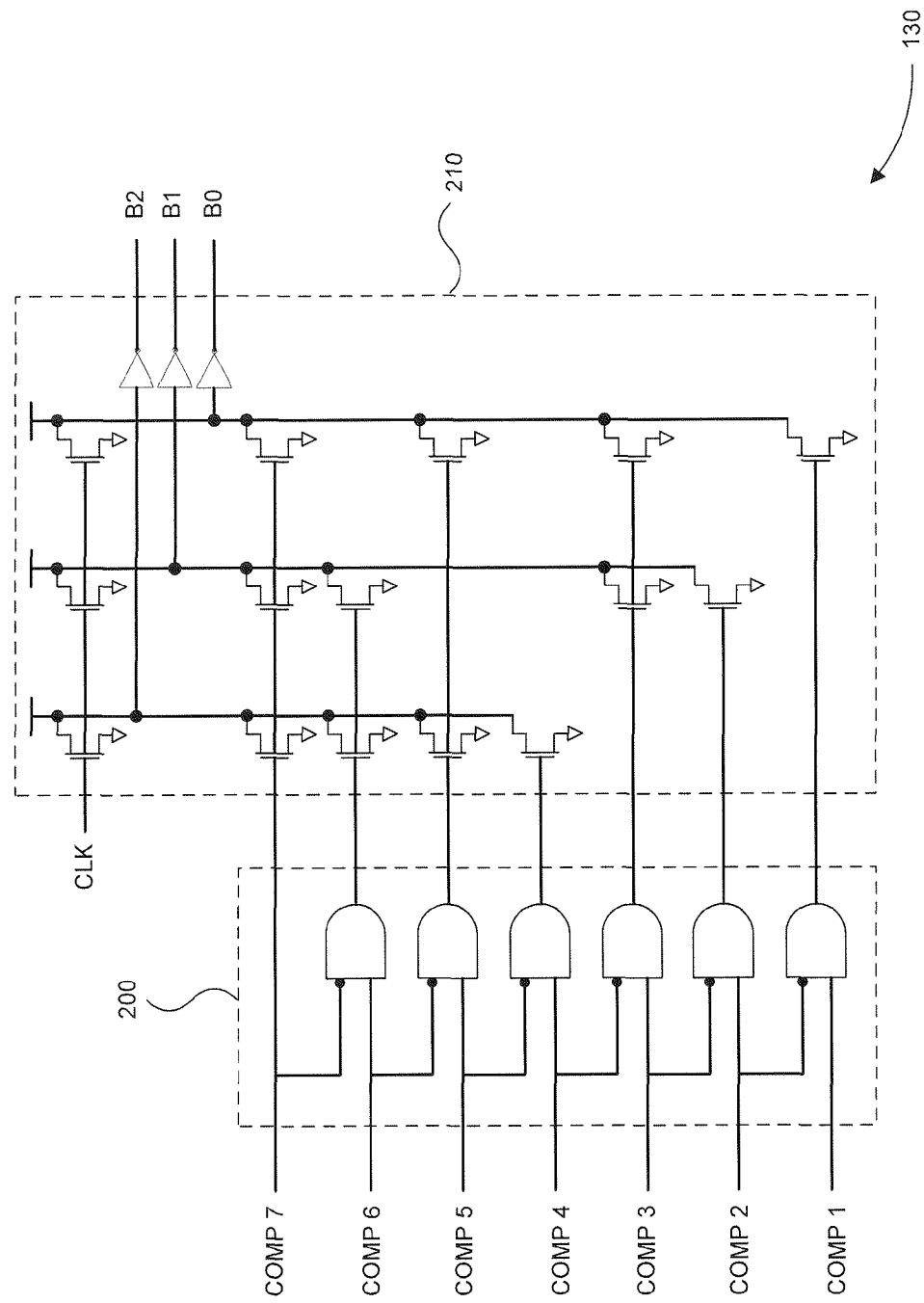
FIG. 4 illustrates a more detailed implementation of the thermometer to binary module illustrated in FIG. 2, according to embodiments of the present invention.

FIG. 4 illustrates an exemplary circuit level implementation of a thermometer to binary module 130, according to embodiments of the present invention. Again, as illustrated in FIG. 4, thermometer to binary module 130 includes a one-out-of N module 200 and a binary ROM encoder module 210. It should be noted that the exemplary circuit level implementation shown in FIG. 4 assumes a simple 3-bit ADC for illustration purposes. However, any size ADC and, correspondingly, any size thermometer to binary module can be used without departing from the scope and spirit of the present invention.

One-out-of N module 200 includes a series of two-input AND gates with the top input of each gate inverted. The AND gates are coupled to comparator outputs COMP 1-7, which form a thermometer code. These series coupled AND gates detect one-to-zero transitions across their respective inputs and provide a logical one as output, if such a transition exists, or a logical zero otherwise. For example, if COMP 6 is a logical zero and COMP 5 is a logical one, then the output of the AND gate in FIG. 4 that receives these two signals will be a logical one. As noted above, a one-to-zero transition in the thermometer code denotes a top.

The output of one-out-of N module 200 forms the one-of-N code, which ideally has a single top denoted by a logical one value (in this instance). Binary ROM encoder module 210 converts the one-of-N code into a 3-bit binary number B2-B0 at its output. Each level or bit of one-of-N code acts as a unique address line to binary ROM encoder module 210. Any logical one value in the one-of-N code will turn on one or more NMOS devices in binary ROM encoder module 210 that it is coupled to and will thereby pull down the bit line coupled to the source/drain of those one or more NMOS devices. It is readily verifiable that the specific arrangement, shown in binary ROM encoder module 210 of FIG. 4, will properly convert the position of the top in the one-of-N code into its binary equivalent represented by bits B2-B0. The three NMOS transistors, illustrated at the top of binary ROM encoder module 210 and coupled to clock signal "CLK" at each of their respective gates, pre-charge the bits lines of binary ROM encoder module 210.

As will be appreciated by one of ordinary skill in the art, with slight modifications to binary ROM encoder module 210, PMOS devices can be used in place of the NMOS devices without departing from the scope and spirit of the present invention. In addition, as will be appreciated by one of ordinary skill in the art, other devices, such as bipolar junction transistors (BJTs) may be used in place of the NMOS devices without departing from the scope and spirit of the present invention.

It should be further noted that ROM encoder module 210 is provided by way of example and not limitation. Other configurations of ROM encoder module 210 can be used without departing from the scope and spirit of the present invention. For example, in another implementation, ROM encoder module 210 is implemented as combinational logic using logical gates.

Examining the basic structure of binary ROM encoder module 210 illustrated in FIG. 4 reveals a potential limitation. Specifically, if two or more address lines of binary ROM encoder module 210 are simultaneously active (i.e., coupled to a logical one value), then the binary output B2-B0 can be widely thrown off from its expected or ideal value. As noted above, two or more tops may exist in the thermometer code, which will cause two or more address lines of binary ROM encoder module 210 to become simultaneously active. Ideally, there should be a single top or transition point in the thermometer code. However, because of random mismatches in the comparators used in the comparator module of a flash ADC, such as comparator module 120 of flash ADC 100 illustrated in FIG. 1, two or more tops can be produced in a single thermometer code.

These inherent mismatches in a comparator create a situation where the comparator is unable to correctly determine which of its two inputs is larger when the difference between the two inputs is less than or equal to the offset caused by the inherent mismatch. For example, if inherent mismatches between devices (e.g., transistors) used to implement a comparator create a 0.02 Volt offset, the comparator with an input 'A' of 0.5 Volts and an input 'V' of 0.51 Volts may incorrectly determine that input A is larger than input B. This issue of inherent mismatches is exacerbated by the continuing decrease in IC operating voltages, which requires smaller voltage reference steps in ADCs and correspondingly tighter comparisons (i.e., comparisons between two voltage values that are close in value).

Figure 5A:
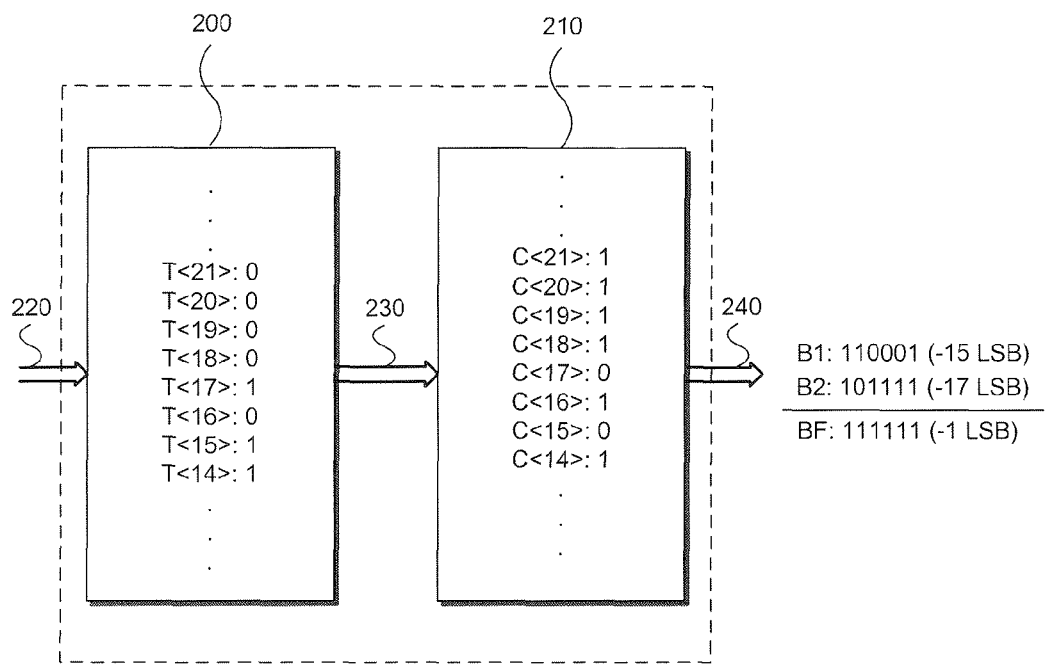
FIG. 5A illustrates a first issue with the thermometer to binary module illustrated in FIG. 2.

FIG. 5A illustrates this potential limitation of binary ROM encoder module 210, when two or more tops are contained within a thermometer code. Specifically, FIG. 5A illustrates an exemplary 64-bit thermometer code T<1:64> received by one-out-of N module 200 at input 220. Only bits or levels 14-21 of interest are shown by the thermometer code in FIG. 5A—bits 1-13 are assumed to contain all logical one values and bits 22-64 are assumed to contain all logical zero values. Two one-to-zero transition points exist in the thermometer code at levels 15 and 17. In the current embodiment, a one-to-zero transition in the thermometer code signifies the point where the reference voltages become larger in magnitude than the analog input of the flash ADC. Thus, only one of the two transitions in the thermometer code of FIG. 5A can be actually correct and the other must be a bubble.

If no bubble correction is performed on the thermometer code by one-out-of N module 200, the potential limitation of binary ROM encoder module 210 becomes apparent. Specifically, one-out-of N module 200 will convert the thermometer code into the one-of-N code C<1:64> shown in FIG. 5A. The one-of-N code denotes both tops that were included within the thermometer code by a logical zero and all other values by a logical one. The two tops in the one-of N code C<1:64> will simultaneously activate two different address lines in binary ROM encoder module 210, resulting in a bit-wise AND of the binary values corresponding to those address lines. In this specific instance, the two binary values are "110001", or −15 LSB, and "101111", or −17 LSB. The bit-wise AND of these two values results in the binary value "111111", or −1 LSB, which widely deviates from the levels of the two tops in the one-of-N code. In all likelihood, the binary code that closely or most accurately represents the input analog voltage falls at or between the levels of the two tops at 15 and 17 in the one-of-N code. Thus, the potential for such a wide deviation in the binary code from the levels of the two tops in the one-of-N code, as illustrated here, can lead to gross errors in the flash ADC output. These gross errors are commonly referred to as sparkle errors.

Figure 5B:
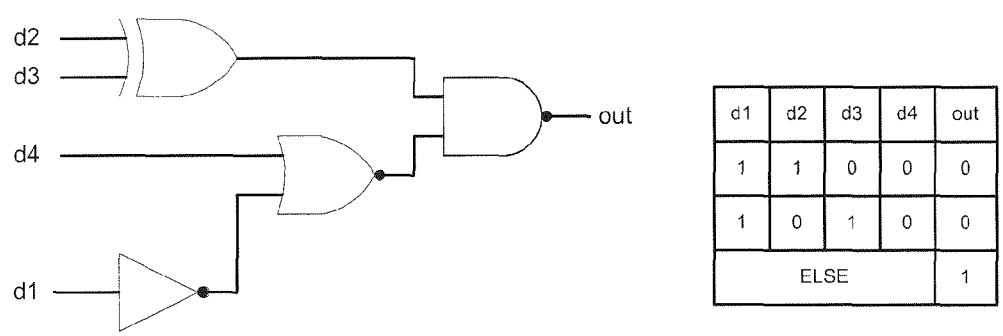
FIG. 5B illustrates a logic level diagram of a unit cell for improving the first issue with the thermometer to binary module illustrated in FIG. 5A, according to embodiments of the present invention.

FIG. 5B illustrates a logical unit-cell 500, and its corresponding truth table, that can be used to prevent such wide deviations in the expected output binary code of a flash ADC when two tops are present in a thermometer code, according to embodiments of the present invention. Specifically, a logical unit-cell 500 can be used in place of each of the simple AND gates of one-out-of N module 200 illustrated in FIG. 4. Logical unit cell 500 includes an XOR gate, an inverter, a NOR gate, and a NAND gate.

As opposed to detecting a simple transition from a logical one value to a logical zero value in the thermometer code (like the AND gates illustrated in FIG. 4), logical unit-cell 500 is configured to detect two patterns in the thermometer code: the pattern "1100" and the pattern "1010." It can be readily verified that by detecting these two patterns, rather than a simple one-bit transition, one of two tops separated by less than two levels in the thermometer code is suppressed. For example, in the previous example illustrated in FIG. 5A, the top at level 17 in the thermometer code will be suppressed, leaving only the single top denoted in the one-of-N code at C<15>. The suppression of the top at C<17> eliminates the potential for a wide deviation in the output binary code produced by binary ROM encoder module 210. Instead, the resulting output binary code will be "101111," or −17 LSB.

Although logical unit-cell 500 provides one solution to prevent wide deviations in the expected binary code produced when two or more tops are present in the thermometer code, logical unit-cell 500 is only able to suppress one of any two tops in a thermometer code that are at most separated by a single level. For example, logical unit-cell 500 is unable to suppress one of two tops within a thermometer code positioned at levels 15 and 19 (i.e., two tops separated by three levels).

Figure 6A:
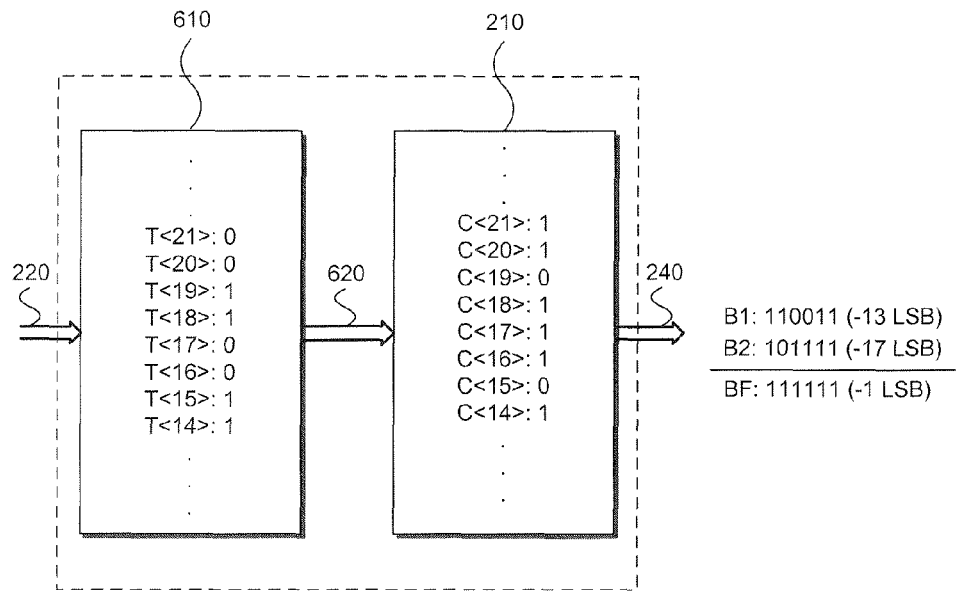
FIG. 6A illustrates a second issue with the thermometer to binary module illustrated in FIG. 2.

FIG. 6A illustrates this potential limitation of logical unit-cell 500, when two or more tops are contained within a thermometer code and are separated by more than a single level. Specifically, FIG. 6A illustrates an exemplary thermometer code T<1:64> received by one-out-of N module 610 at input 220 of thermometer to binary module 600. One-out-of N module 610, illustrated in FIG. 6A, implements logical unit-cell 500 in place of the AND gate configuration illustrated in FIG. 4. Only bits or levels 14-21 of interest are shown by the thermometer code in FIG. 6A—bits 1-13 are assumed to contain all logical one values and bits 22-64 are assumed to contain all logical zero values. Two one-to-zero transition points exist in the thermometer code at levels 15 and 19. In the current embodiment, a one-to-zero transition point in the thermometer code signifies the point where the reference voltages become larger in magnitude than the analog input of the flash ADC. Thus, only one of the two transitions in the thermometer code of FIG. 6A can be actually correct and the other must be a bubble.

One-out-of N module 610 will produce the one-of-N code C<1:64> shown in FIG. 6A. As can be seen and readily verified, the one-of-N code C<1:64> denotes two tops at levels 15 and 19. The two tops in the one-of N code C<1:64> will simultaneously activate two different address lines in binary ROM encoder module 210, resulting in a bit-wise AND of the binary values corresponding to those address lines. In this specific instance, the two binary values are "110011", or −13 LSB, and "101111", or −17 LSB. The bit-wise AND of these two values results in the binary value "111111", or −1 LSB, which widely deviates from the levels of the two tops in the one-of-N code and results in a sparkle error.

Figure 6B:
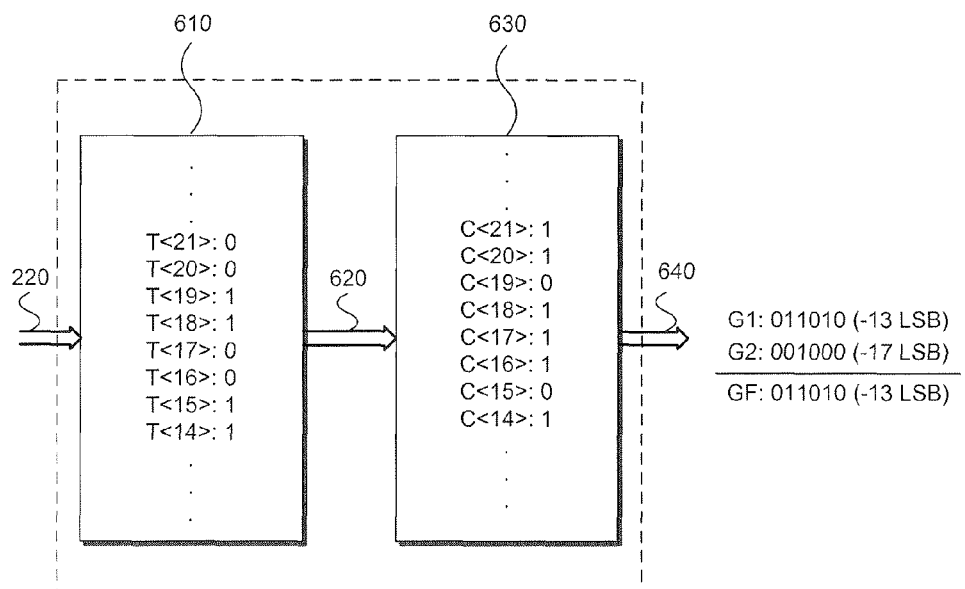
FIG. 6B illustrates an operational level solution for improving the second issue with the thermometer to binary module illustrated in FIG. 6A, according to embodiments of the present invention.

FIG. 6B illustrates an additional modification that can be made to the exemplary structure of thermometer to binary module 130 illustrated in FIG. 4 to prevent such wide deviations in the expected output binary code of a flash ADC when two tops are present in the thermometer code and are separated by two or more levels, according to embodiments of the present invention. Specifically, a Gray ROM encoder module 630 can be used in place of binary ROM encoder module 210 in thermometer to binary module 650. Gray ROM encoder module 630 includes a substantially similar structure as binary ROM encoder module 210 illustrated in FIG. 4. However, the switches (e.g., NMOS devices) in binary ROM encoder module 210 are arranged in Gray ROM encoder module 630 to provide a Gray code at output 640.

In general, a Gray code sequence is characterized by the fact that there is only one bit difference between any two adjacent numbers of the sequence. For example in a 3-bit Gray code, the Gray code corresponding to a decimal value of three is "011" and the Gray code corresponding to a decimal value of four is "010". As is readily apparent, these two adjacent values differ by only a single bit. In contrast to a Gray code sequence, adjacent numbers in a binary code sequence may differ by several bits between any two adjacent numbers of the sequence.

Assuming the same thermometer code illustrated in FIG. 6A is received by one-out-of N module 610 in FIG. 6B, the same one-of-N code C<1:64> will be generated, with two tops denoted at levels 15 and 19. However, Gray ROM encoder module 630 produces two different binary representations for levels 15 and 19 than binary ROM encoder module 210. Specifically, the two binary representations produced by Gray ROM encoder module 630 are "011010", or −13 LSB, and "001000", or −17 LSB. The bit-wise AND of these two values results in the binary value "011010", or −13 LSB in Gray code, which unlike the implementation of thermometer to binary module 600 in FIG. 6A, does not widely deviate from the levels of the two tops in the one-of-N code. This improvement is due to the inherent characteristic of the Gray code, where any two consecutive codes differ by only a single bit. The resultant Gray code "011010" produced at output 640 is subsequently provided to a Gray to Binary converter module (not shown), which provides the final, traditional binary output code.

Figure 7A:
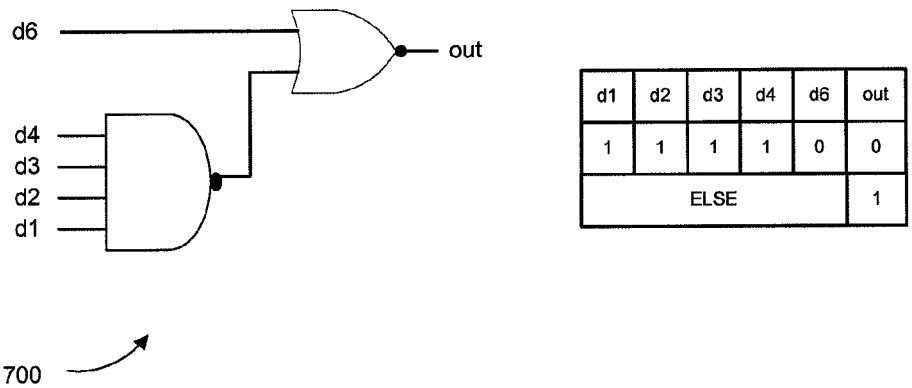
FIG. 7A illustrates a logic level diagram of a unit cell for further improving the second issue with the thermometer to binary module illustrated in FIG. 6A, according to embodiments of the present invention.

Although Gray ROM encoder module 630 provides a viable option for improving the resultant binary code produced by a thermometer to binary module when two or more tops are contained within a given thermometer code and are separated by two or more levels, an additional module dedicated to removing bubbles in a thermometer code can be used. Specifically, as illustrated in FIG. 7A, a logical unit-cell 700 can be used to further remove bubbles or extra tops in a given one-of-N code. Logical unit-cell 700 includes a 4-input NAND gate and a 2-input NOR gate that can be used as the basis for thermometer to binary module 130. The truth table corresponding to logical unit-cell 700 is further illustrated in FIG. 7A.

In an embodiment, a dedicated bubble correction module can be implemented in a thermometer to binary module, such as thermometer to binary module 650, that includes a logical unit-cell 700 for each level of a given one-of-N code. For example, for a one-of-N code with 64 levels, 64 logical unit-cells 700 can be utilized. The logical unit-cells 700 corresponding to levels toward the bottom of a one-of-N code can be slightly simplified from the full version of logical unit-cell 700, as will be appreciated by one of ordinary skill in the art based on the teachings herein.

The logical unit-cells 700 in such a dedicated bubble correction module will be coupled at their respective inputs, d1, d2, d3, d4, and d6, to six different levels of a one-of-N code. Logical unit-cell 700 is configured to detect any top within the five levels below the specific one-of-N code level coupled to the input d6. The level of one-of-N code coupled to the input d6 can be generically referred to as the current level in the one-of-N code being analyzed. Each level in the one-of-N code will be coupled to a d6 input of a respective logical unit-cell 700 and will be analyzed as explained further below.

Assuming d6 is coupled to a level in the one-of-N code that contains a top, denoted by a logical zero value in this instance, logical unit-cell 700 will verify that the levels of the one-of-N code that are two, three, four, and five levels below the level coupled to d6 do not also contain a top. If any of these levels, coupled at inputs d4, d3, d2, and d1 respectively, do contain a top, the top coupled to d6 is suppressed (i.e., changed from a logical zero to a logical one in the bubble corrected one-of-N code). In an embodiment, the level directly below the level of the one-of-N code coupled to input d6 does not need to be checked. This is simply because one-out-of N modules 200 and 610 will never produce a one-of-N code with two tops that are adjacent to each other. However, in another embodiment the level directly below the level of the one-of-N code coupled to input d6 is further coupled to an input of the NAND gate of logical unit-cell 700 and checked.

By coupling each level in the one-of-N code to a d6 input of a respective logical unit-cell 700, one of any two tops that are within five levels of each other in the one-of-N code is suppressed. More specifically, the top corresponding to the higher level of any two tops that are within five levels of each other in the one-of-N code is suppressed. The output "out" of logical unit cell 700 replaces the value of one-of-N code coupled to input d6 in the bubble corrected one-of-N code (formed by the outputs of each logical unit cell 700). For levels being analyzed towards the bottom of a one-of-N code, which do not have one or more levels below their current position, the extra inputs of the NAND gate in logical unit-cell 700 can be tied to a logical one value or these extra inputs can be removed or synthesized away.

It should be noted that logical unit-cell 700 can be modified to only suppress tops that are within fewer than five levels of each other. For example, logical unit-cell 700 can be modified to only suppress one of any two tops that are within three or fewer levels of each other. This modification can be made by replacing the 4-input NAND gate illustrated in FIG. 7A, with a 2-input NAND gate (inputs d1 and d2 will be removed). In the implementation where logical unit-cell 700 is modified to only suppress one of any two tops that are within two or fewer levels of each other, the NAND gate is reduced to an inverter. Moreover, it should be noted that logical unit-cell 700 can be modified such that the top corresponding to the lower level of a one-of-N code may be suppressed, rather than the top corresponding to the higher level of a one-of-N code.

It addition, it should be noted that logical unit-cell 700 can be modified to suppress tops that are within greater than five levels of each other as will be appreciated by one of ordinary skill in the art.

Figure 7B:
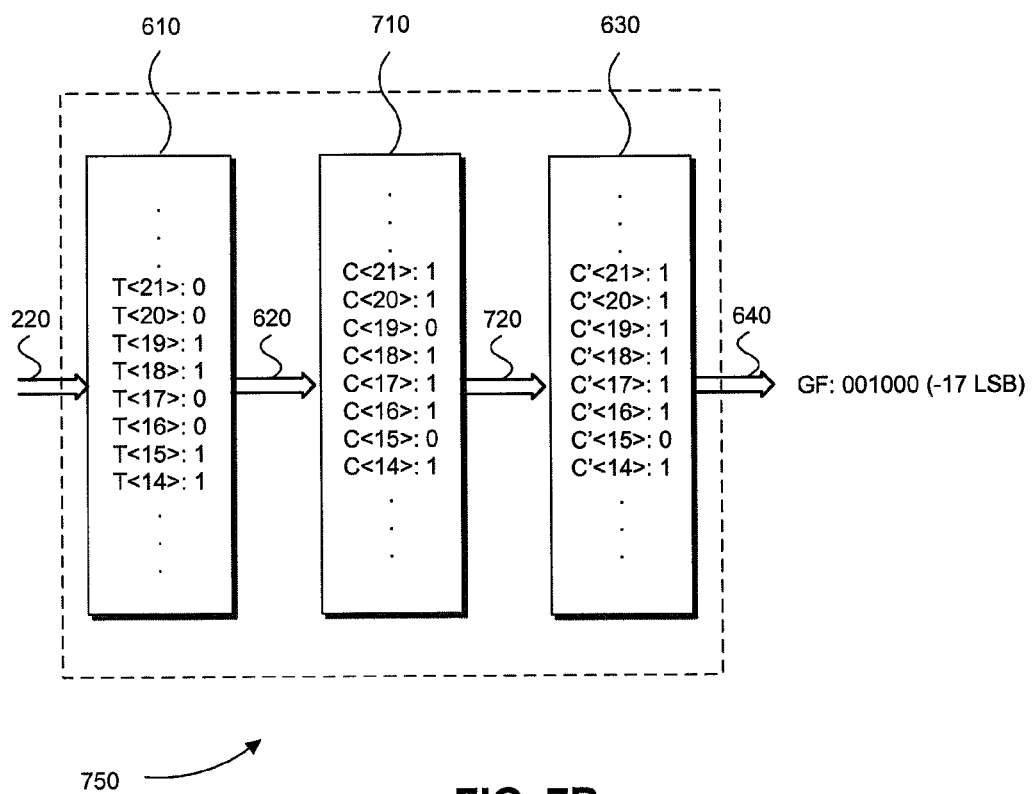
FIG. 7B illustrates the operation of a thermometer to binary module implementing the unit cell of FIG. 7A, according to embodiments of the present invention.

FIG. 7B illustrates a thermometer to binary module 750 that includes one-out-of N module 610, a dedicated bubble correction module 710 (which implements a logical unit-cell 700 illustrated in FIG. 7A for each level or bit of a received one-of-N code), a Gray ROM encoder module 630, and Gray to Binary converter module (not shown).

FIG. 7B illustrates an exemplary thermometer code T<1:64> received by one-out-of N module 610 at input 220. As noted above, one-out-of N module 610 implements logical unit-cell 500 illustrated in FIG. 5B in place of the AND gate configuration illustrated in FIG. 4. Only bits or levels 14-21 of interest are shown by the thermometer code in FIG. 7B—bits 1-13 are assumed to contain all logical one values and bits 22-64 are assumed to contain all logical zero values. Two one-to-zero transition points exist in the thermometer code at levels 15 and 19. In the current embodiment, a one-to-zero transition point in the thermometer code signifies the point where the reference voltages become larger in magnitude than the analog input of the flash ADC. Thus, only one of the two transitions in the thermometer code of FIG. 7B can be actually correct and the other must be a bubble.

One-out-of N module 610 will produce the one-of-N code C<1:64> shown in FIG. 7B at output 620. As can be seen and readily verified, the one-of-N code C<1:64> denotes two tops at levels 15 and 19. Dedicated bubble correction module 710 receives and processes one-of-N code C<1:64>. During processing by dedicated bubble correction module 710, the logical unit-cell 700 configured to analyze level 19 of the one-of-N code, will suppress the top at this position because a top at level 15, which is within five levels of level 19, exists. All other values will remain the same in one-of-N code. This bubble corrected one-of-N code C'<1:64> is provided to Gray ROM encoder module 630 at output 720. Gray ROM encoder module 630 will produce the Gray code "001000" (i.e., −17 LSB) at output 640, which corresponds to level 15 containing the sole top in the bubble corrected one-of-N code. This Gray code is subsequently provided to a Gray to Binary converter module (not shown), which provides the final binary output code.

It should be noted that dedicated bubble correction module 710 can be used in any implementation of the thermometer to binary module disclosed herein without departing from the scope and spirit of the present invention. For example, dedicated bubble correction module 710 can be implemented between one-out-of N module 200 and binary ROM encoder module 210 of thermometer to binary module 130 illustrated in FIG. 2, or between one-out-of N module 610 and binary ROM encoder module 210 of thermometer to binary module 600 illustrated in FIG. 6A.

Moreover, it should be noted that a flash ADC implementing a thermometer to binary module that includes dedicated bubble correction module 710 can be used in many different applications. For example, such a flash ADC can be implemented in the front-end of a high-data rate receiver. That flash ADC can be positioned in the front-end to receive and convert a received analog transmission into a clean, digital signal for processing by modules further down the receiver chain. In one embodiment, such a flash ADC can be used in a receiver front-end prior to a decision feedback module, which may be sensitive to sparkle errors. As will be appreciated by one of ordinary skill in the art, these applications are provided by way of example and not limitation.

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A thermometer to binary module for converting a thermometer code into a binary code, comprising:
   a one-out-of N module configured to provide a one-of-N code based on the thermometer code;
   a bubble correction module configured to provide a bubble corrected one-of-N code by suppressing at least one of any two tops that are not separated by at least two levels within the one-of-N code; and
   a ROM encoder module configured to convert the bubble corrected one-of-N code into a binary code.

2. The thermometer to binary module of claim 1, wherein the one-out-of N module is configured to detect a top in the thermometer code.

3. The thermometer to binary module of claim 2, wherein the one-out-of N module is configured to detect the top where a logical one is followed immediately by a logical zero in the thermometer code.

4. The thermometer to binary module of claim 2, wherein the one-out-of N module is configured to detect the top where either two successive logical ones are followed immediately by two successive logical zeros in the thermometer code, or where a logical one is followed immediately by a logical zero which is followed immediately by a logical one which is followed immediately by a logical zero in the thermometer code.

5. The thermometer to binary module of claim 2, wherein the one-out-of N module is configured to denote the top detected in the thermometer code by either a logical zero or a logical one in the one-of-N code, and any other value in the thermometer code that is not a top by a logical value that is opposite to the logical value used to denote the top.

6. The thermometer to binary module of claim 1, wherein the bubble correction module is configured to suppress the at least one of any two tops that are not separated by at least two levels within the one-of-N code by changing a logical value of the at least one of any two tops from a logical zero to a logical one or a logical one to a logical zero.

7. The thermometer to binary module of claim 6, wherein the one-of-N code has 64 levels and the bubble correction module is configured to suppress the at least one of any two tops if they are not separated by at least five levels within the one-of-N code by changing a logical value of the at least one of any two tops from a logical zero to a logical one or a logical one to a logical zero.

8. The thermometer to binary module of claim 1, wherein the bubble correction module comprises a plurality of bubble correction unit cells.

9. The thermometer to binary module of claim 8, wherein one or more of the plurality of bubble correction unit cells comprise:
a first logical gate coupled to a first bit in the one-of-N code; and
a second logical gate coupled to at least a second bit in the one-of-N code that is two levels above or below the first bit in the one-of-N code,
wherein an output of the second logical gate is an input to the first logical gate.

10. The thermometer to binary module of claim 9, wherein the first logical gate is a NOR gate and the second logical gate is either an inverter or a NAND gate.

11. The thermometer to binary module of claim 1, wherein the ROM encoder module comprises a binary-ROM encoder configured to convert the bubble corrected one-of-N code into the binary code.

12. The thermometer to binary module of claim 1, wherein the ROM encoder module comprises a Gray-ROM encoder configured to convert the bubble corrected one-of-N code into a Gray code and a Gray to binary converter configured to convert the Gray code into the binary code.

13. An analog-to-digital converter (ADC), comprising:
a voltage reference module configured to generate a plurality of voltage references;
a comparator module configured to compare an input voltage to the plurality of voltage references to generate a thermometer code; and a thermometer to binary module comprising:
a one-out-of N module configured to provide a one-of-N code based on the thermometer code;
a bubble correction module configured to provide a bubble corrected one-of-N code by suppressing at least one of any two tops that are not separated by at least two levels within the one-of-N code; and
a ROM encoder module configured to convert the bubble corrected one-of-N code into a binary code.

14. The ADC of claim 13, wherein the one-out-of N module is configured to detect a top in the thermometer code.

15. The ADC of claim 14, wherein the one-out-of N module is configured to detect the top where a logical one is followed immediately by a logical zero in the thermometer code.

16. The ADC of claim 14, wherein the one-out-of N module is configured to detect the top where either two successive logical ones are followed immediately by two successive logical zeros in the thermometer code, or where a logical one is followed immediately by a logical zero which is followed immediately by a logical one which is followed immediately by a logical zero in the thermometer code.

17. The ADC of claim 14, wherein the one-out-of N module is configured to denote the top detected in the thermometer code by either a logical zero or a logical one in the one-of-N code, and any other value in the thermometer code that is not a top by a logical value that is opposite to the logical value used to denote the top.

18. The ADC of claim 13, wherein the bubble correction module is configured to suppress the at least one of any two tops that are not separated by at least two levels within the one-of-N code by changing a logical value of the at least one of any two tops from a logical zero to a logical one or a logical one to a logical zero.

19. The ADC of claim 18, wherein the one-of-N code has 64 levels and the bubble correction module is configured to suppress the at least one of any two tops if they are not separated by at least five levels within the one-of-N code by changing a logical value of the at least one of any two tops from a logical zero to a logical one or a logical one to a logical zero.

20. The ADC of claim 13, wherein the bubble correction module comprises a plurality of bubble correction unit cells.

21. The ADC of claim 20, wherein one or more of the plurality of bubble correction unit cells comprise:
a first logical gate coupled to a first bit in the one-of-N code; and
a second logical gate coupled to at least a second bit in the one-of-N code that is two levels above or below the first bit in the one-of-N code,
wherein an output of the second logical gate is an input to the first logical gate.

22. The ADC of claim 21, wherein the first logical gate is a NOR gate and the second logical gate is either an inverter or a NAND gate.

23. The ADC of claim 13, wherein the ROM encoder module comprises a binary-ROM encoder configured to convert the bubble corrected one-of-N code into the binary code.

24. The ADC of claim 13, wherein the ROM encoder module comprises a Gray-ROM encoder configured to convert the bubble corrected one-of-N code into a Gray code and a Gray to binary converter configured to convert the Gray code into the binary code.

* * * * *